United States Patent [19]

Jin et al.

[11] Patent Number: 5,346,775
[45] Date of Patent: Sep. 13, 1994

[54] ARTICLE COMPRISING SOLDER WITH IMPROVED MECHANICAL PROPERTIES

[75] Inventors: Sungho Jin, Millington; Mark T. McCormack, Summit, both of N.J.

[73] Assignee: AT&T Laboratories, Murray Hill, N.J.

[21] Appl. No.: 21,005

[22] Filed: Feb. 22, 1993

[51] Int. Cl.$^5$ .............................................. C22C 1/10
[52] U.S. Cl. .................................. 428/614; 428/545; 228/180.2
[58] Field of Search ................... 428/614; 148/108; 428/545; 228/179, 189, 56.3, 180.2

[56] References Cited

U.S. PATENT DOCUMENTS

| | | | |
|---|---|---|---|
| 2,451,099 | 10/1948 | La Motte | 428/614 |
| 3,566,512 | 3/1971 | Lane | 428/614 |
| 3,998,669 | 12/1976 | Strnat | 428/558 |
| 4,663,242 | 5/1987 | Pryor et al. | 428/614 |
| 5,066,544 | 11/1991 | Betrabet et al. | 428/614 |
| 5,088,007 | 2/1992 | Missele | 428/614 |
| 5,089,356 | 2/1992 | Chung | 428/614 |
| 5,093,545 | 3/1992 | McGaffigan | 228/56.3 |
| 5,134,039 | 7/1992 | Alexander et al. | 428/614 |

FOREIGN PATENT DOCUMENTS

| | | | |
|---|---|---|---|
| 2916299 | 10/1980 | Fed. Rep. of Germany | 428/614 |
| 2281742 | 10/1990 | Japan | 228/56.3 |
| 1383517 | 3/1988 | U.S.S.R. | 228/56.3 |

OTHER PUBLICATIONS

J. L. Marshall, et al. "Microcharacterization of Composite solders", *Proceedings of the Technical Program*, vol. III, pp. 1278–1283, (1992) no month.

R. B. Clough, et al. "Preparation and Properties of Reflowed Paste and Bulk Composite Solder", *Proceedings of the Technical Program*, vol. III, pp. 1256–1265, (1992) no month.

J. L. Marshall, et al. "Composite Solders", *IEEE Transactins on Components, Hybrids, and Manufacturing Technology*, vol. 14, No. 4, pp. 698–702 (1991) no month.

D. R. Frear, "Thermomechanical Fatigue in Solder Materials", *Solder Mechanics*, Chapter 5, pp. 191–237 (1990) no month.

J. W. Morris, et al. "Toward New Solders With Improved Fatigue Resistance", *Solder Mechanics*, Chapter 6, pp. 239–270 (1990) no month.

D. A. Jeannotte, et al. "Package Reliability", *Microelectronics Packaging Handbook*, Chapter 5, pp. 225–359 (1989) no month.

T. C. Reily, "Package-To-Board Interconnections", *Microelectronics Packaging Handbook*, Chapter 11, pp. 779–851 (1989) no month.

W. B. Hampshire, "Soldiers", *Electronic Materials Handbook*, vol. 1, pp. 633–642 (1989) no month.

*Primary Examiner*—Michael Lewis
*Assistant Examiner*—N. M. Nguyen
*Attorney, Agent, or Firm*—Eileen D. Ferguson; Eugen E. Pacher

[57] ABSTRACT

New solder compositions which can have improved mechanical properties are disclosed. In a preferred embodiment, the solder comprises a matrix material and magnetically dispersed particles. A desirable dispersion of the magnetic particles in the matrix material, is accomplished by applying a magnetic field to the molten matrix material containing magnetic particles and solidifying it in the presence of the magnetic field. The particle-dispersed microstructures improve the mechanical properties of the solder composition. The improved solder composition can be made into a powder to be used in solder paste, cream or reshaped while substantially retaining the improved mechanical properties.

12 Claims, 3 Drawing Sheets

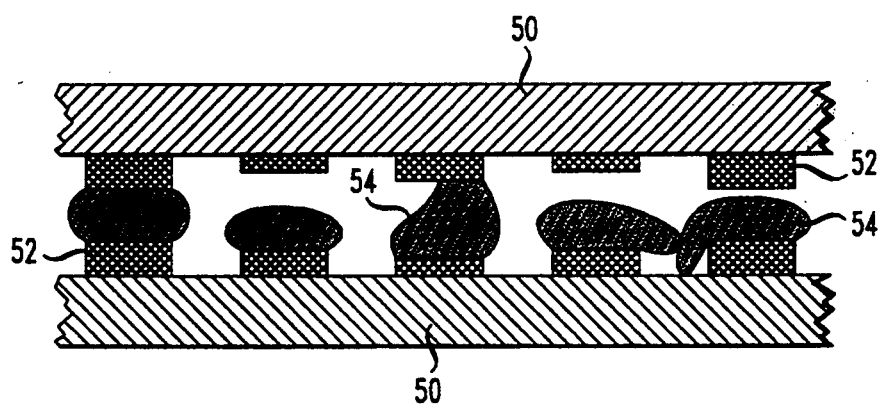
FIG. 4
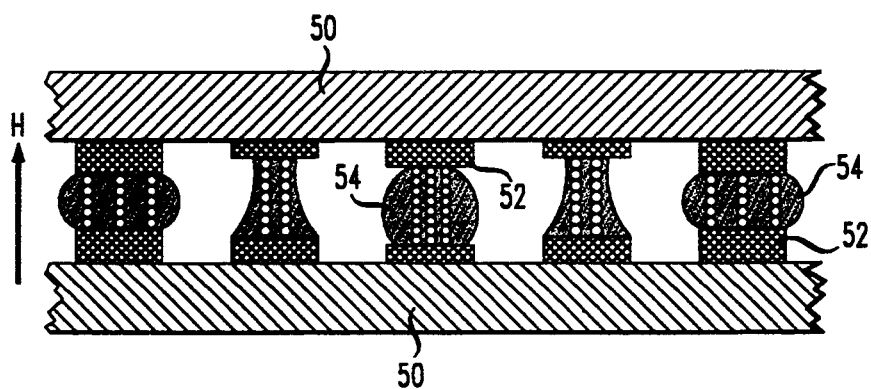
FIG. 5
FIG. 6
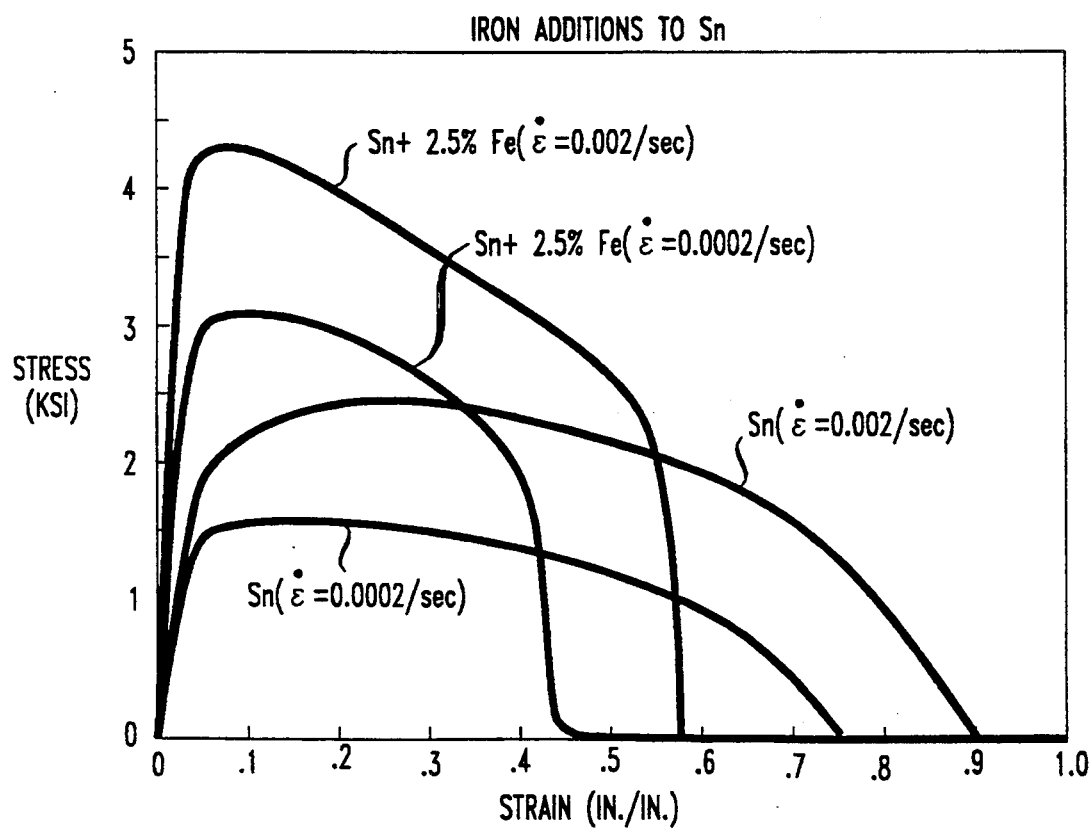

EFFECT OF Fe DISPERSION ON CREEP DEFORMATION AT 100°C

CREEP DEFORMATION OF 57Bi-43Sn SOLDER AT 100°C

ARTICLE COMPRISING SOLDER WITH IMPROVED MECHANICAL PROPERTIES

FIELD OF THE INVENTION

This invention relates to solder materials with improved mechanical properties and a method of making such a solder.

BACKGROUND OF THE INVENTION

Solder is an almost ubiquitous constituent of, e.g., electronic and optoelectronic systems. Among the many available solder alloys, the lead-tin (Pb-Sn) solder system is by far the most commonly used in industry today. However, even that mature solder system still has shortcomings, including joint failures. Such failures are frequently caused by creep and thermal fatigue. Stresses induced during thermal cycling because of thermal expansion mismatch are usually unevenly distributed, causing local recrystallization and microstructural coarsening. Such structural coarsening can lead to thermal fatigue crack growth and solder joint failure. Such fatigue and creep problems can be reduced by stabilizing a fine, mechanically strong microstructure and preventing structural coarsening through dispersion of fine particles (e.g., $Cu_6Sn_5$) in the solder matrix. See, e.g. R. B. Clough, et al., Proc. NEPCON WEST '92, Feb. 23–27, 1992, Anaheim, Calif. Cahners Exposition Group, 1992, "Preparation and Properties of Reftowed Paste and Bulk Composite Solder", p. 1256. However, providing a uniform mixture of fine particles and molten solder is not an easy task as the density difference between the dispersoid particles and the molten solder (e.g., the density of Sn-Sb solder is approximately 7.2, that of Pb-Sn approximately 8.5, and that of Fe is approximately 7.9) often causes gravity-induced segregation of the particles, resulting in a macroscopically nonuniform particle distribution.

Agglomeration and coarsening of the particles is another frequently encountered problem. Because of these problems relatively large amounts (e.g. 10–40% by volume) of dispersoid typically is required in prior art compositions to obtain detectable strengthening and improvement in creep resistance. The presence of large amounts of dispersoid particles, however, tends to cause deleterious side effects such as loss of molten solder fluidity and porosity trapping. The use of other dispersoid particles in the Pb-Sn solder has been disclosed by, e.g., J. L. Marshall et al., Proc. NEPCON WEST, "Microcharacterization of Composite Solders", p. 1278, (1992), however, no significant improvement in creep resistance was reported.

A further shortcoming of Pb-Sn solder is its toxicity. Because pending legislation and EPA regulations threaten to make the use of Pb in solder much more expensive, or even ban the use of Pb-bearing solders altogether, there has been increasing interest in the development of Pb-free solders to replace currently used Pb-Sn alloys. Known Pb-free solders, however, have shortcomings in a number of material properties. These shortcomings also increase the likelihood of solder joint failures during both assembly and service by causing broken parts, misalignments, open circuits, shorts, or noisy connections.

This application discloses solder materials, including Pb-free solder materials, with improved properties, exemplarily improved mechanical strength: and creep resistance.

SUMMARY OF THE INVENTION

The present invention is embodied in ,articles that comprise new solder compositions which can have improved mechanical properties. In a preferred embodiment, the improved solder comprises fine magnetic (i.e., ferromagnetic ferrimagnetic) particles in a solder matrix material. Significantly, the particles are substantially dispersed throughout at least a portion of the matrix material, typically having an ordered distribution, whereby typically significantly improved mechanical properties are achieved. The particle dispersion, in defiance of the commonly observed gravity-induced segregation problem/particle agglomeration problem, is formed by a process that comprises applying a magnetic field to molten matrix material containing the magnetic particles. The application of the magnetic field desirably causes ordering of the magnetic particles. The details of the ordered distribution of magnetic particles depend inter alia on the particle size, i.e. diameter, volume fraction of the magnetic particles, magnetic properties of the particles and matrix material viscosity. When the magnetic particles have a relatively large diameter (e.g. the average diameter being greater than 10 $\mu$m) and/or constitute a relatively small volume fraction, (e.g., less than 2%), the magnetic particles typically tend to form columns (chain-of-spheres) in the molten matrix substantially along the magnetic field direction. When the magnetic particles have a relatively small diameter (e.g., the average diameter being less than 5 $\mu$m) and/or a relatively large volume fraction, (e.g., greater than 5%), the magnetic particles typically tend to form interconnected chains (three-dimensional networks) in the matrix. Herein we will refer to all such magnetic field-induced ordering as "patterning", and to the resulting at least partially ordered distribution of particles as a "pattern". After applying the magnetic field for a time sufficient to result in patterning, the molten mass is solidified. The resulting combination of matrix material with a frozen-in pattern of particles therein, typically exhibits significantly improved material properties, as compared to an otherwise identical material that does not contain magnetic particles. The improved solder composition can be made into a powder, to be used in solder paste or cream, or be re-cast or otherwise reshaped, typically while substantially retaining the improved mechanical properties.

Exemplarily, in an embodiment of the inventive solder composition, the solder matrix material is tin (Sn) and the magnetic particles are iron (Fe), which represents 2.5% by weight of the solder. While the Sn is in a molten state, this composite is placed in a 500 oersted magnetic field and then solidified. The resultant solder has a patterned distribution of the particles, and has better mechanical properties than Sn.

BRIEF DESCRIPTION OF THE DRAWINGS

FIG. 4 schematically illustrates open circuit or short circuit defects in prior art solder interconnections.

FIG. 5 schematically illustrates an aspect of the invention, namely shaping of molten solder according to the invention by application of a magnetic field.

FIG. 6 shows stress/strain data for an exemplary composition according to the invention, and for tin.

DETAILED DESCRIPTION

Figure 1:
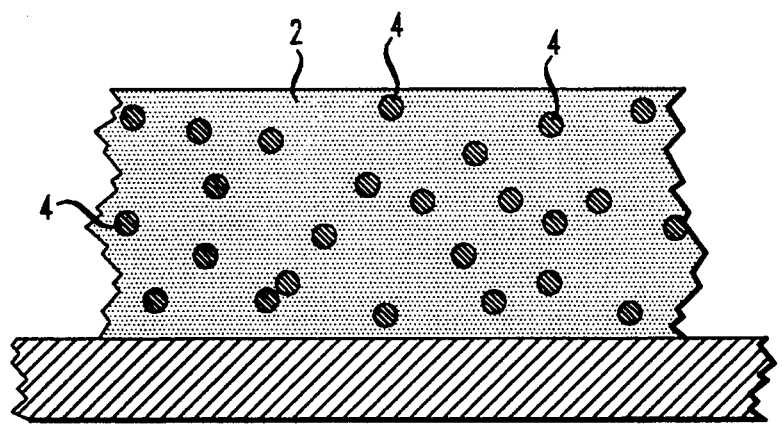
FIG. 1 illustrates the dispersed and suspended magnetic particles in molten solder before pattern formation.
Figure 2:
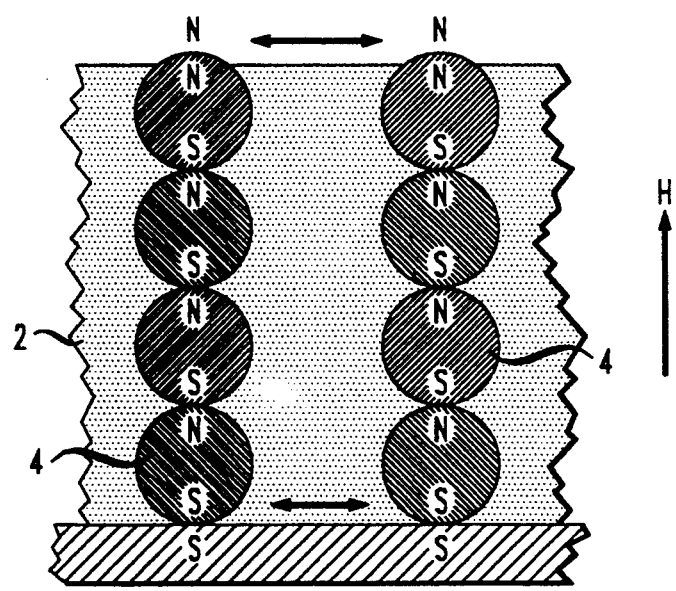
FIG. 2 illustrates a columnar pattern of magnetic particles in molten solder in the presence of a magnetic field.
Figure 3:
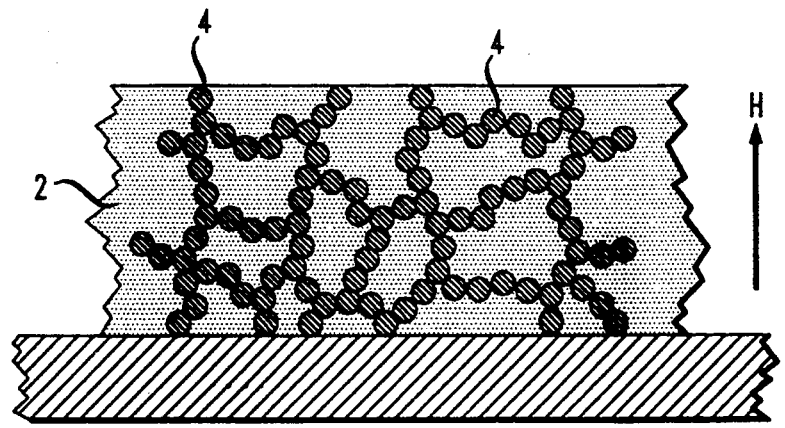
FIG. 3 illustrates a three-dimensional chain-like pattern of magnetic particles in molten solder in the presence of a magnetic field.

The present invention is embodied in articles that comprise a new solder composition which can have improved mechanical properties. In a preferred embodiment, referring to FIG. 1, a solder matrix material 2 and fine magnetic particles 4 are in combination and the solder matrix material is melted such that the magnetic particles 4 are substantially dispersed and suspended in the molten solder 2. We have discovered that if a combination as shown in FIG. 1 is subjected to a magnetic field before substantial gravity-induced segregation takes place then the magnetic particles in the matrix material can arrange themselves into an ordered distribution or pattern. Examples of typical patterns are shown in FIGS. 2 and 3. The molten matrix material is then cooled and solidified in the presence of the magnetic field or immediately after turning off the field in order to freeze the pattern.

The magnetic particles may be of any shape, e.g., spherical, elongated, plate-like or randomly shaped. Typical particle size desired is in the range of 0.05-500 $\mu$m, preferably in the range of 0.5-100 $\mu$m. The desired volume fraction of the magnetic dispersoid particles in the solder is typically in the range of 0.2-50%, and preferably in the range of 0.5-10%.

The magnetic particles may be coated with a thin layer of a suitable metal, preferably a metal easily wettable by the molten matrix material. An appropriate coating layer can frequently be beneficial not only in improving wetting and mixing with the molten matrix material but also in preventing oxidation of the fine magnetic particles. Micron-sized or submicron-sized particles frequently can easily converted to oxide thus possibly creating problems of non-wetting and increased density disparity. An example of suitable coating material is Sn or Ag on the particles of Fe, Sin-Co alloy, Ni-Fe alloy, or $Fe_3O_4$. Such a coating may be provided by a number of different techniques, such as electroless plating, electroplating or physical vapor deposition.

The magnetic particles advantageously are selected to retain their magnetism at the melting point of solder, enabling the particles to respond to the magnetic field. In other words, the Curie temperature of the particles typically is higher than the temperature of the molten matrix material, typically in the range of 100°-300° C. for many known solders. Particles of ferromagnetic metals such as Fe, Co, Ni or alloys such as Fe-Ni, Fe-V, Sin-Co, and Nd-Fe-B may be used either separately or in combination. The alloys may be crystalline, amorphous, or semicrystalline. Alternatively, ferromagnetic or ferrimagnetic oxide, nitride, carbide, boride, fluoride, etc. particles (e.g., $\gamma$-$Fe_2O_3$, $Fe_3O_4$, $Fe_4N$ particles, $NiO\cdot Fe_2O_3$-type cubic ferrite, or $BaO\cdot 6Fe_2O_3$-type hex-a-ferrite particles) may also be used as magnetic particles. Metal or alloy particles are in general preferred to oxide particles when the inventive solder composition is used for circuit interconnections without a magnetic field. This is because oxide materials tend to have substantially lower density than molten metal matrix material, and thus may experience more severe gravity-induced segregation of particles.

The magnetic material may react with the coating material and/or the molten matrix material during processing, and convert to an intermetallic compound The presence of such intermetallic compound on the surface of dispersoid particle (e.g. $SnFe_2$ or $Sn_2Fe_3$ layer on Fe particles) is sometimes beneficial as the wetting and mixing behavior of the particles can be improved. Care must be taken, however, so that the magnetic dispersion processing is completed before extensive metallurgical reaction between the matrix material and the particle or complete loss of ferromagnetism takes place. Once the magnetic alignment is in place, the loss of magnetism in the dispersoid particles is not important from a mechanical property point of view, unless future reflow and realignment in the presence of a magnetic field is necessary. The extent of matrix material-particle reaction is dependent on various processing conditions such as temperature, time, cooling rate, etc., which may be adjusted depending on specific applications and considerations.

The matrix material is typically selected from low melting point (e.g., below approximately 500° C.) metals and alloys such as Sn, In, Bi, Pb, Sb, Zn or alloys containing two or more elements such as Sn-Bi, Sn-Ag, Sn-Sb, In-Ag, Zn-Sn, Pb-Sn, Pb-Sn-Ag, Sn-Bi-Cu. Additional alloying elements such as Cu, Au, Ag, Sb, etc. may also be incorporated.

The magnetic field used to align the particles into the patterns may be applied in any direction, but preferably in the direction of circuit interconnection if the circuit packaging is to be done in the presence of a magnetic field. The field may be of DC (constant strength and direction) or AC (time-dependent variation in strength and/or direction) type. For efficient magnetic dispersion, sufficient magnetic field strength has to be applied. Typical desired strength of the applied magnetic field is about 10-20,000 oersteds (Oc), preferably in the range of 100-5000 Oe. The optimal value of the magnetic field strength depends on the nature of the magnetic particles such as the saturation induction, magnetic permeability, particle size and volume fraction, as well as the viscosity and dimension of the molten matrix material. A stronger magnetic field typically needs to be applied for smaller particles, smaller volume fraction of low-saturation, low-permeability magnetic particles, and thinner layers of molten solder. In the case of molten matrix with no upper constraints (e.g., preparation of solder plates or sheets with magnetic dispersion for future processing into solder preforms by cold rolling), too high a magnetic field tends to form an undesirable overgrowth of the columns of magnetic particles above the surface level of the molten solder.

The combining of magnetic particles with the matrix material prior to applying the magnetic field may be done in one of several different ways. One way is to form a substantially homogeneous mixture of powder magnetic particles and powder of the desired matrix material by manual mixing, ball milling or mechanical alloying. Alternatively, the magnetic particles may be vigorously stir mixed into molten matrix material, possibly together with solder flux chemicals.

Yet another way of mixing is to blend the magnetic powder and the matrix material powder in a liquid medium to form a semi-viscous slurry (e.g. by mixing with water, alcohol, or solvent with optional organic binder which can later be evaporated or burned off), apply a magnetic field to align the magnetic particles into desired chain or network configuration in the slurry, dry the mix in the presence: of the magnetic field, and sinter or lightly melt the matrix material particles. The composite prepared by this last method may be remelted or plastically deformed, if needed, for further densification with or without an applied magnetic field, or may be used as is, with or without an applied magnetic field.

In the presence of a magnetic field of appropriate strength, the magnetic particles form ordered distributions or patterns of varying types. Examples of such patterns are parallel, vertically-oriented columns (chain-of-spheres) as shown in FIG. 2, and interconnected chains (three-dimensional networks) as shown in FIG. 3. For the purpose of dispersion strengthening of solder, the three-dimensional network structure in FIG. 3 is, comparatively speaking, frequently more desirable than the (itself desirable) vertical column structure in FIG. 2, as microscopically more uniform dispersion is achieved and the likelihood of anisotropic mechanical behavior is reduced.

The presence of fine dispersoid particles in the solder can also result in additional indirect refinement of the solder microstructure during solidification of the molten matrix material, e.g., the dispersoid particles may act as nucleation sites for solidification structure, and also grain growth may be impeded. The undesirable structural coarsening in the solder during service (e.g., by thermal cycling) frequently will be minimized as the growing interfaces or grain boundaries would have to overcome the resistance by the particles.

It is desirable to minimize the coarsening of the dispersoid particles during service. The selection of dispersoid material which has little or no solubility in the molten matrix material is desirable, as the diffusion of the dispersoid element through the matrix material can be difficult and subsequent coarsening can be much slower. Fe is an excellent example. Although it forms intermetallic compounds with Sn, it has very little solubility in various molten solder metals and alloys such as Sn. In, Bi. Ni, on the other hand, readily reacts with Sn to make a non-magnetic or less magnetic compound which, under certain circumstances, may inhibit the desirable alignment process.

The solders of the invention may be prepared for use in any known form e.g. bars, plates, or ingots for use in the wave soldering or dip soldering operation, in the form of preforms such as ribbons, wires, washers or patterned sheets for soldering mating devices, or in the form of powders mixed with flux and other appropriate chemical constituents to prepare solder pastes or creams for surface mounting type interconnection operations.

As shown in FIG. 4, printed circuit boards 50 or other circuit devices, e.g., silicon wafers, frequently have some variations in height, resulting in nonuniform pad 52-to-pad 52 distances between the mating devices. These conditions can induce defects such as open circuit or short circuit if prior art solder 54 is used. We have discovered that if a strong magnetic field (e.g., >1000 Oe) is applied during final melting and solidification of solder according to the invention, the molten solder bumps containing the magnetic particles can protrude vertically and contract sideway, as shown in FIG. 5, thus increasing the chance for contact with the upper device pad 52 and reducing the likelihood of an open circuit even if there is extra spacing between the mating pads. Additionally, the occurrence of an undesirable short circuit in the horizontal direction is reduced. The magnetic assembly technique can also minimize molten solder joint collapse by heavy surface mounted devices because of the vertical, supporting, magnetic force provided by the aligned magnetic particles in the solder due to the presence of magnetic field.

While the application of the magnetic field during the final melting and solidification of the solder in the magnetic assembly technique generally ensures the fine dispersion of the magnetic particles, the use of the magnetic field may be omitted if previously magnetically-dispersed solder of the invention is melted and solidified in a reasonably fast manner before extensive gravity-induced segregation of particles takes place. Some loosening of the patterned structure may occur but the basic fine-dispersion nature will essentially be preserved. Furthermore, the magnetic assembly technique can leave permanent magnetism in the solder material, which may be undesirable for certain device applications or handling/shipping. A demagnetizing field may be applied to eliminate this problem.

Typically larger magnetic particles (greater than 10 $\mu$m and preferably greater than 25 $\mu$m) are preferred for the magnetic assembly applications for providing increased magnetic force. The large particles may be used in combination with fine particles to achieve dispersion strengthening at the same time. Alternatively, a combination of magnetic particles of different materials with different magnetic and other physical properties, or different reactivity with the matrix material, may also be used.

In the following examples, remarkably improved strength and resistance to creep deformation by the magnetic dispersion of fine particles is described. Such a noticeable improvement is particularly interesting because only a small amount of particles (compared to the prior an dispersion-strengthened solder) is used, which represents the high efficiency of magnetic dispersion with minimum segregation and agglomeration of particles.

EXAMPLES

Example 1

Approximately two micrometer diameter iron powder was chemically coated by a known technique with a submicrometer layer of tin. This coated iron powder was then mixed by mechanical ball milling with 100 mesh tin powder in hexane to form a slurry (dry proportions 2.5% by weight Fe, remainder Sn). This slurry was then allowed to dry in an argon atmosphere in order to reduce the chances of oxidation. Hexane was chosen as it leaves little residue. The dry powder mixture was then sealed in a quartz tube with argon atmosphere and melted at 800 degree C for two minutes, shaken, and then placed in a 500 oersted magnetic field. After solidification, the ingot was shaped into a 0.165 inch rod. A gauge length of 0.5 inches was machined to a reduced gauge diameter of 0.125 inches and tensile tests were performed, and compared with samples without the iron addition which were prepared in the same manner. The results are shown in FIG. 6. The ultimate tensile strength of the iron containing specimens was improved by 60% at a strain rate of 0.002/sec. and 100% at a strain rate of 0.0002/sec.

Example 2

Figure 7:
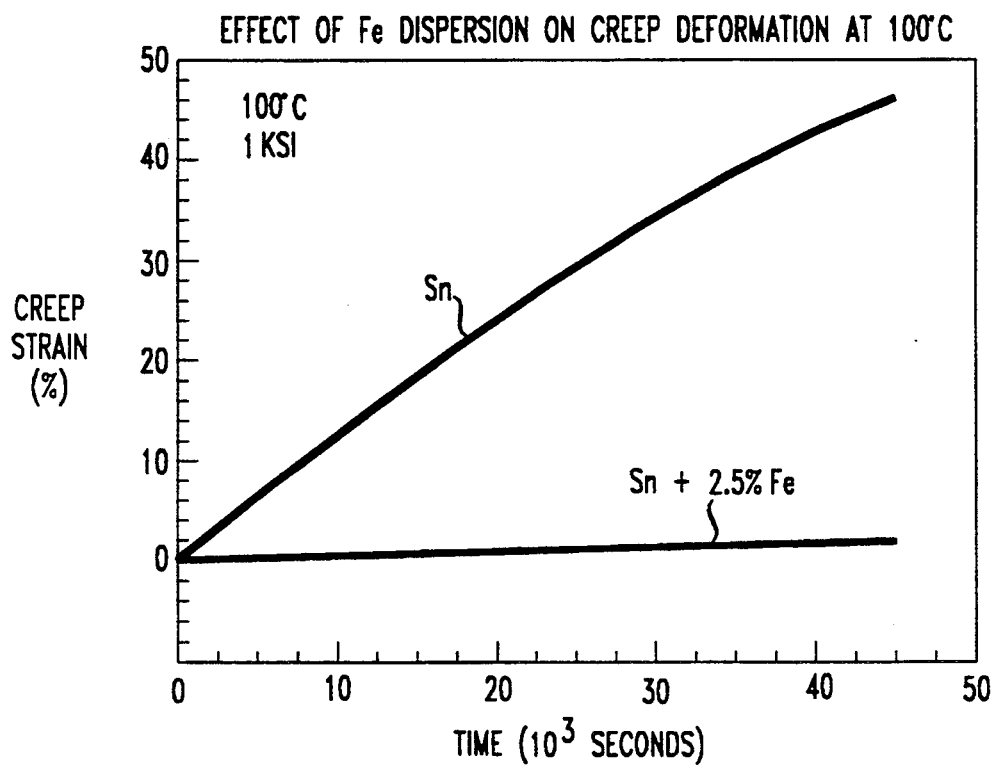
FIG. 7 illustrates the amount of creep deformation as a function of time at 100° C. for Sn solder-with and without magnetically dispersed Fe particles.

The magnetically-dispersed solder of Example 1 was subjected to compression creep testing and compared with the solder without Fe addition. Rod-shape samples about 0.150 inch diameter and 0.180 inch height were tested under 1000 psi pressure at 100° C. for up to approximately 24 hrs. The percentage of creep deformation in the magnetically dispersion-hardened sample was dramatically reduced by more than a factor of 20, as shown in FIG. 7.

Example 3

1% by weight of tin-coated, 2 μm size Fe powder was added to 57% Bi43% Sn solder alloy and magnetic field processed, substantially as in Example 1. The alloy exhibited approximately 10% improvement in the ultimate tensile strength compared to the Bi-Sn alloy without the Fe particle addition.

Example 4

Figure 8:
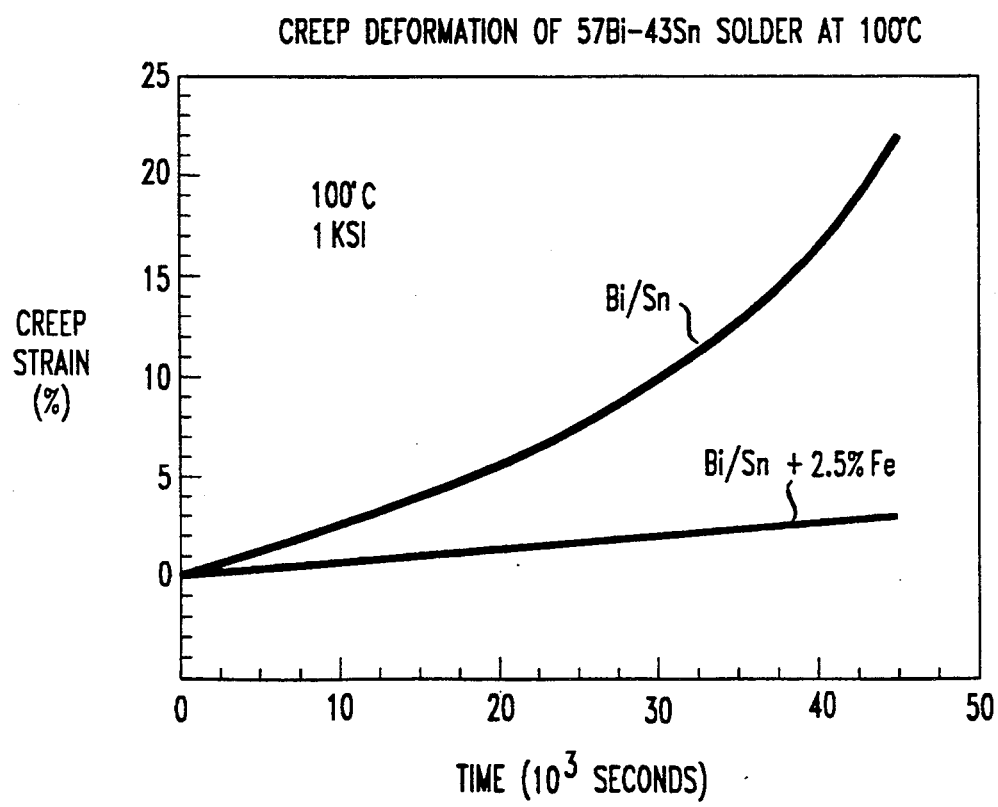
FIG. 8 illustrates the amount of creep deformation as a function of time at 100° C. for Bi-Sn solder with and without magnetically dispersed Fe particles.

2.5% by weight of iron was added to the Bi-Sn alloy similarly as in Example 3. After compressive creep testing at 100° C. for approximately 12 hrs. under 1000 psi pressure, the percentage of creep deformation in the Fe-containing alloy was reduced at least by a factor of 5 when compared with the Fe-free sample, as shown in FIG. 8.

Example 5

1% by weight of iron was added to a 43% Pb-43% Sn-14% Bi solder and processed similarly as in the Example 1. The iron-containing alloy exhibited approximately 11% improvement in the ultimate tensile strength and reduced creep deformation by a factor of 2 when compared with the Fe-free sample.

Example 6

The solder material in Example 1 is subjected to fatigue testing at 100° C. for 1000 cycles. The maximum stress before failure is approximately 1600 psi as compared to 1200 psi for the sample without Fe particle dispersion.

We claim:

1. An article comprising a solder composition comprising a solder matrix material and magnetic particles, wherein said particles have a magnetic field-induced substantially ordered distribution either in a columnar pattern oriented substantially in the direction of a magnetic field which was or is applied to said solder composition or in a three dimensional chain network in at least a portion of the solder matrix material and said particles represent a volume fraction of said solder composition in the range of 0.5–10%.

2. An article according to claim 1, wherein said particles form a substantially columnar pattern.

3. An article according to claim 1, wherein said particles form a substantially three-dimensional chain network.

4. An article according to claim 1, wherein said solder matrix material comprises a metal selected from the group consisting of Sn, Bi, Sb, Zn, In and Pb.

5. An article according to claim 1, wherein said particles comprise material selected either from ferrimagnetic oxides or from ferromagnetic materials in the group consisting of element metal, mixtures of elemental metal oxides, nitrides, carbides, borides and fluorides.

6. An article according to claim 1, wherein said particles have a Curie temperature greater than 300° C.

7. An article according to claim 1, wherein said magnetic particles are in the range of 0.05 to 500 μm.

8. An article according to claim 1, wherein at least some of said magnetic particles are coated with a metal layer which is wettable in said matrix material.

9. An article according to claim 8, wherein the metal layer is more oxidation resistant than the magnetic particles.

10. A solder composition according to claim 1, wherein said solder composition has a room temperature yield strength and ultimate strength which respectively are at least 10% greater than the room temperature yield strength and ultimate strength of an otherwise identical comparison solder composition without magnetic particles.

11. A solder composition according to claim 1, wherein said solder composition has a creep deformation at 1000 psi at 100° C. which is at least 50% less than the creep deformation of an otherwise identical comparison solder composition without magnetic particles.

12. A solder composition according to claim 1, wherein said solder composition has a maximum stress for failure by fatigue crack growth which is at least 20% greater than the maximum stress for failure by fatigue crack growth of an otherwise identical solder composition without magnetic particles.

* * * * *